US007473568B2

United States Patent
Co et al.

(10) Patent No.: US 7,473,568 B2
(45) Date of Patent: Jan. 6, 2009

(54) MEMORY-MODULE MANUFACTURING METHOD WITH MEMORY-CHIP BURN-IN AND FULL FUNCTIONAL TESTING DELAYED UNTIL MODULE BURN-IN

(75) Inventors: Ramon S. Co, Trabuco Canyon, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 448 days.

(21) Appl. No.: 11/308,869

(22) Filed: May 17, 2006

(65) Prior Publication Data

US 2007/0269911 A1   Nov. 22, 2007

(51) Int. Cl.
*H01L 21/66* (2006.01)
(52) U.S. Cl. .................. 438/18; 257/E21.524
(58) Field of Classification Search .......... 438/11, 438/18; 257/E21.523, E21.524
See application file for complete search history.

(56) References Cited

U.S. PATENT DOCUMENTS

| | | | | |
|---|---|---|---|---|
| 5,532,612 | A |   | 7/1996 | Liang ..................... 324/760 |
| 5,539,652 | A |   | 7/1996 | Tegethoff ................. 703/14 |
| 5,764,574 | A |   | 6/1998 | Nevill et al. ............. 365/200 |
| 6,008,538 | A | * | 12/1999 | Akram et al. ............ 257/723 |
| 6,287,878 | B1 | * | 9/2001 | Maeng et al. ............. 438/15 |
| 6,384,613 | B1 |   | 5/2002 | Cheng et al. ............. 324/754 |
| 6,574,763 | B1 |   | 6/2003 | Bertin et al. ............. 714/738 |
| 2003/0089978 | A1 |   | 5/2003 | Miyamoto et al. ........ 257/723 |
| 2003/0159278 | A1 |   | 8/2003 | Peddle ..................... 29/832 |
| 2003/0179635 | A1 |   | 9/2003 | Terzioglu et al. ......... 365/201 |
| 2005/0125712 | A1 |   | 6/2005 | Co et al. .................. 714/718 |
| 2005/0189267 | A1 |   | 9/2005 | Beffa ...................... 209/573 |
| 2006/0023548 | A1 |   | 2/2006 | Hiraki et al. ............. 365/222 |
| 2006/0049844 | A1 |   | 3/2006 | Neyer et al. .............. 324/765 |

* cited by examiner

*Primary Examiner*—Chandra Chaudhari
(74) *Attorney, Agent, or Firm*—Stuart T. Auvinen; gPatent LLC

(57) ABSTRACT

Reliable memory modules are assembled from partially-tested memory chips that are neither individually burned-in nor fully tested. Instead, individual memory chips are partially tested to screen out gross failures and then assembled into memory modules that are inserted into memory-module burn-in boards and placed into a burn-in oven. The memory modules are stressed during burn-in by high temperatures and applied voltages. After burn-in, the memory modules are removed from the memory-module burn-in boards and extensively tested. Functional tests include many test patterns to test all memory locations in the partially-tested memory chips on the memory modules. Tests are performed at corner conditions such as high temperature and voltage. Infant mortality and single-bit faults are detected by the functional tests after module burn-in. The number of insertions into burn-in boards is reduced by the number of memory chips per module minus one, so handling and test costs are reduced.

20 Claims, 8 Drawing Sheets

FRONT SIDE

MEMORY-MODULE MANUFACTURING METHOD WITH MEMORY-CHIP BURN-IN AND FULL FUNCTIONAL TESTING DELAYED UNTIL MODULE BURN-IN

FIELD OF THE INVENTION

This invention relates to semiconductor test procedures, and more particularly to burn-in testing of memory chips and memory modules.

BACKGROUND OF THE INVENTION

Memory modules are one of the most widely used electronic components. Personal computers (PC's) and other electronic systems often use small printed-circuit board (PCB) daughter cards known as memory modules instead of directly mounting individual memory chips on a motherboard. The memory modules are constructed to meet specifications set by industry-standard groups, thus ensuring a wide potential market. High-volume production and competition have driven module costs down dramatically, benefiting the electronics buyer.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The memory modules contain a small printed-circuit board substrate, typically a multi-layer board with alternating laminated layers of fiberglass insulation and foil or metal interconnect layers. Surface mounted components such as DRAM chips, buffer chips, and capacitors are soldered onto one or both surfaces of the substrate.

FIG. 1 shows a memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 could be a fully-buffered dual-inline memory module (FB-DIMM) that is fully buffered by Advanced Memory Buffer (AMB) 24 on memory module 10. Some other kinds of memory modules do not have AMB 24, or have other kinds of buffers.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

Memory modules are produced in high volumes, and there are many manufacturers of memory modules. Since memory modules have become a commodity, pricing of memory modules is critical to a manufacturer's success or failure. Manufacturers need to keep costs down. Costs include the cost of making DRAM chips, module parts and assembly, and testing. Testing costs currently add 10 cents to one dollar to the cost of each DRAM chip, and a memory module may contain 8 or more DRAM chips.

To improve reliability, burn-in testing is sometimes performed. DRAM chips can be heated and have higher power-supply voltages (Vcc) applied to stress the DRAM chips and speed up the occurrence of failures. The passing DRAM chips are less likely to fail and thus have higher reliability, as do memory modules made from these pre-stressed DRAM chips. Unfortunately, such burn-in testing also increases manufacturing costs.

FIG. 2 is a flow chart of a prior-art burn-in test flow for making memory modules. DRAM chips are made in a wafer fab and are packaged, perhaps after wafer-sort testing of the die. These packaged DRAM chips are received by a memory-module manufacturer, step 202. An initial D.C. test of these packaged DRAM chips is performed, step 204. This initial D.C. test can check for opens, shorts, excessive power drain, and some basic functional testing may also be included.

DRAM chips that pass the initial D.C. test are inserted into test sockets on a memory-chip burn-in board, step 206. The memory-chip burn-in boards are placed in a burn-in oven, and the DRAM chips are heated over a period of time. Stress voltages may also be applied during burn-in.

After the burn-in time period, the memory-chip burn-in boards are removed from the burn-in oven, step 208, and individual DRAM chips are extracted from sockets on the memory-chip burn-in board. The DRAM chips are tested more extensively using a full functional test that writes and reads all memory locations on each DRAM chip, perhaps with several test patterns, step 210. This testing is likely performed on an expensive ATE tester, and the functional tests take some time, increasing test costs.

The DRAM chips may be heated or cooled during functional testing, and the applied voltages may be changed to higher and lower values such as +/−10% during testing, step 212. Steps 210 and 212 could be performed at the same time on the same tester, or could be separate tests requiring separate insertions into the tester.

DRAM chips that pass the functional tests after burn-in are reliable chips and can be used to make reliable memory modules. Passing DRAM chips are soldered to module substrate boards to assemble memory modules, step 214. Once the memory modules are assembled, the modules may be tested, step 216, to screen for faulty solder connections.

FIG. 3 illustrates a prior-art burn-in test flow for making memory modules. DRAM dice are made in a factory or wafer fab and are tested and packaged as DRAM chips 22. Some wafer-sort testing may be performed to determine which die to package and which die to discard.

Packaged DRAM chips 22 are initially tested by being placed into test socket 108, which connects to ATE test head 102 of an automated-test-equipment (ATE). ATE testers are very expensive, typically being million-dollar machines. DRAM chips 22 that pass testing on ATE test head 102 are inserted into test sockets on memory-chip burn-in board 106. Once populated with many DRAM chips 22, memory-chip burn-in board 106 is inserted into burn-in oven 104 for several hours, days, or weeks of applied stress.

A stress voltage may be applied to the power-supply or other pins of DRAM chips 22 by memory-chip burn-in board 106 while inside burn-in oven 104. This allows DRAM chips 22 to be stressed by both high heat and high voltage, such as 125 degrees C. and 5.5 volts. Applied voltages to signal pins may be toggled high and low for added stress.

After a period of time in burn-in oven 104, memory-chip burn-in board 106 is removed from burn-in oven 104 and DRAM chips 22 are removed from test sockets on memory-chip burn-in board 106. DRAM chips 22 are then tested again on ATE test head 102, and failing chips are discarded. If the period of time in burn-in oven 104 is sufficiently long, failures known as infant mortalities can be screened out, increasing reliability of the remaining DRAM chips 22.

DRAM chips 22 that pass the post-burn-in test on ATE test head 102 are soldered to substrate boards during assembly of memory module 10. Memory modules may then be tested, either on ATE test head 102 or on another tester, and shipped to customers.

A single memory module may contain several DRAM chips, such as 8 or more DRAM chips per module. Each of these 8 or more DRAM chips 22 must be inserted into test sockets on memory-chip burn-in board 106 before insertion into burn-in oven 104, and each of the 8 or more DRAM chips 22 must be removed from these test sockets on memory-chip burn-in board 106 after removal from burn-in oven 104. Inserting and removing DRAM chips into test sockets on memory-chip burn-in board 106 may be performed manually, which is tedious and time consuming.

A disadvantage of this burn-in process is that each memory module with 8 DRAM chips requires 8 insertions and 8 removals, or a total of 16 insertion/removal steps per module with 8 DRAM chips. A human operator likely can only insert or remove one DRAM chip at a time.

What is desired is a manufacturing method and test flow that is more efficient. A burn-in test flow that reduces the number of insertions/removals per memory module is desirable. A test flow with reduced test cost is also desired. Testing using less expensive testers than million-dollar ATE test machines is also desired.

DETAILED DESCRIPTION

The present invention relates to an improvement in memory module burn-in testing and manufacture. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
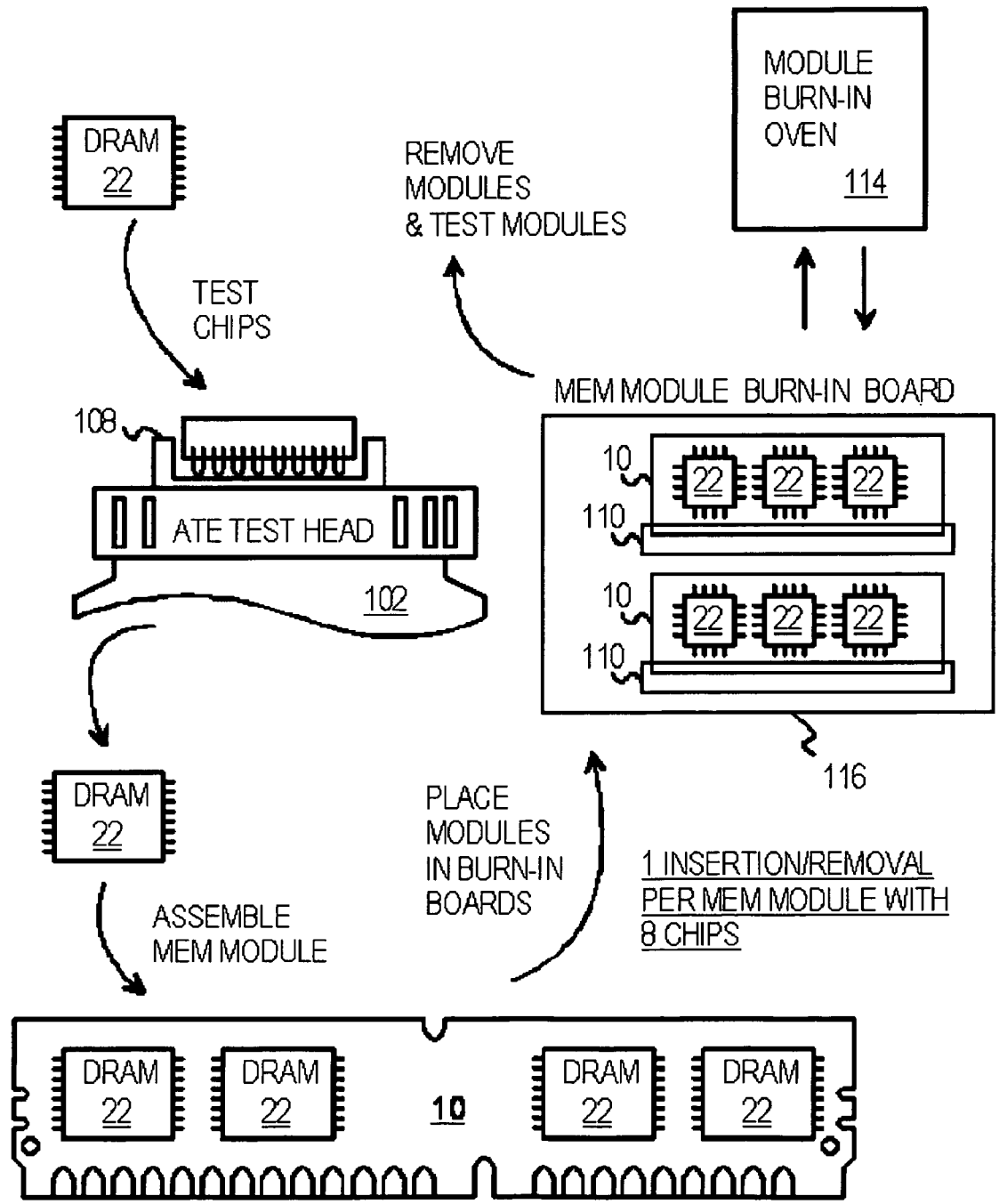
FIG. 4 highlights a test flow that burns in assembled memory modules rather than individual DRAM chips.

FIG. 4 highlights a test flow that burns in assembled memory modules rather than individual DRAM chips. Wafers of DRAM die are packaged into packages such as ball-grid-array (BGA) or thin-small-outline packages (TSOP) and delivered to the memory module manufacturer. The packaged DRAM chips are inserted into test socket 108 on ATE test head 102 and an initial test is performed. This initial test is limited so that the amount of time spent on ATE test head 102 for each DRAM chip is minimized, thus minimizing per-chip test costs. This initial test can include D.C. tests such as opens, shorts, power, and some limited functional tests. However, full functional tests with many test patterns are not performed at this stage.

The passing DRAM chips are soldered onto module substrates to build memory modules 10. These DRAM chips have not yet passed burn-in testing. Thus some infant mortalities may occur. However, when yields are high, such failures are small enough that the savings in test costs offsets any re-work costs.

The assembled memory modules may be tested in a simple memory module tester that costs much less than ATE test head 102. The assembled memory modules are inserted into memory module sockets 110 on memory-module burn-in board 116. Memory-module burn-in board 116 is then inserted into burn-in oven 114, and the memory modules are heated and voltage-stressed.

After the burn-in time period, memory-module burn-in board 116 is removed from burn-in oven 114 and memory modules 10 are removed from memory-module burn-in board 116. Memory modules 10 are then extensively tested on a memory module tester. Functional test patterns that test all memory locations on all DRAM chips on the memory module are executed in this final test.

Since each memory module contains several DRAM chips, such as 8 DRAM chips, these 8 DRAM chips are simultaneously tested in parallel. This parallel testing reduces test time compared with running the same test patterns on individual DRAM chips inserted into ATE test head 102. Also, low-cost memory-module testers that are based on personal-computer motherboards may be used rather than million-dollar ATE machines. Thus test cost may be significantly reduced.

Figure 3:
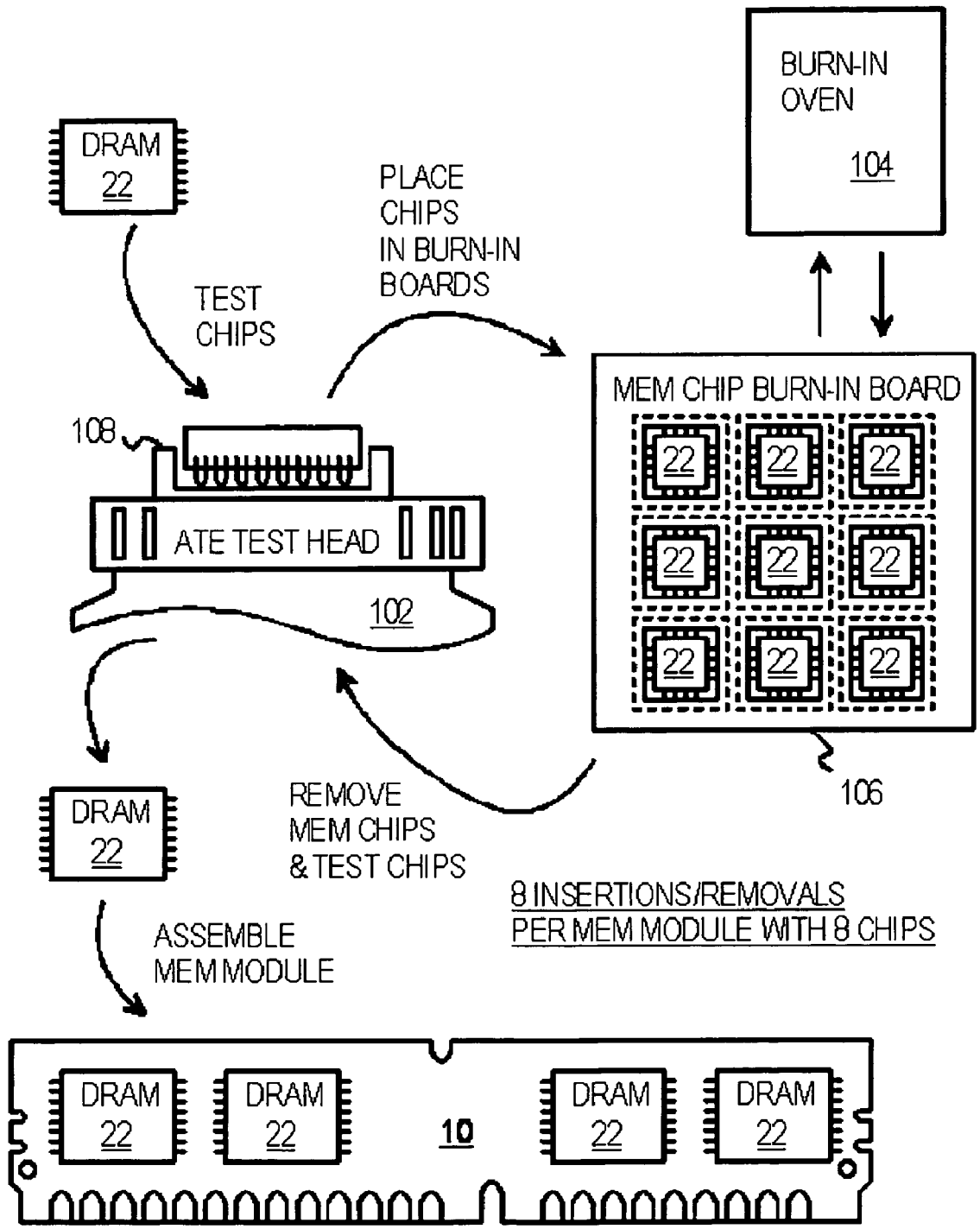
FIG. 3 illustrates a prior-art burn-in test flow for making memory modules.

In this test flow, an entire memory module is inserted into memory module socket 110 on memory-module burn-in board 116. Only one insertion and one removal operation is required for burn-in. A memory module contains many DRAM chips, such as 8 DRAM chips. One insertion and removal allows 8 DRAM chips to be burned-in and tested together. In contrast, as shown in FIG. 3, the 8 individual DRAM chips require 8 insertions and 8 removals from memory-chip burn-in board 106.

Figure 1:
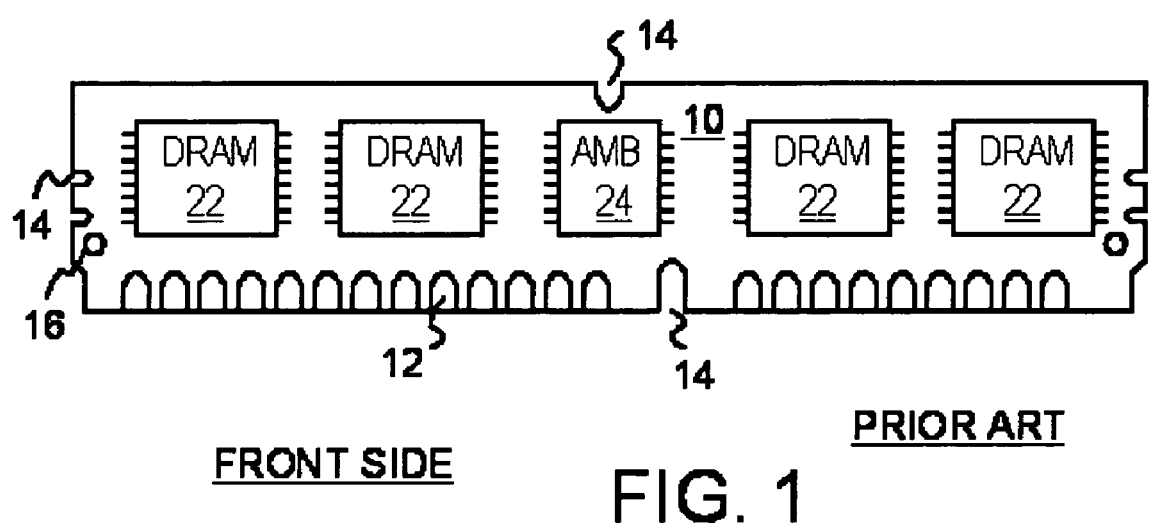
FIG. 1 shows a memory module.
Figure 2:
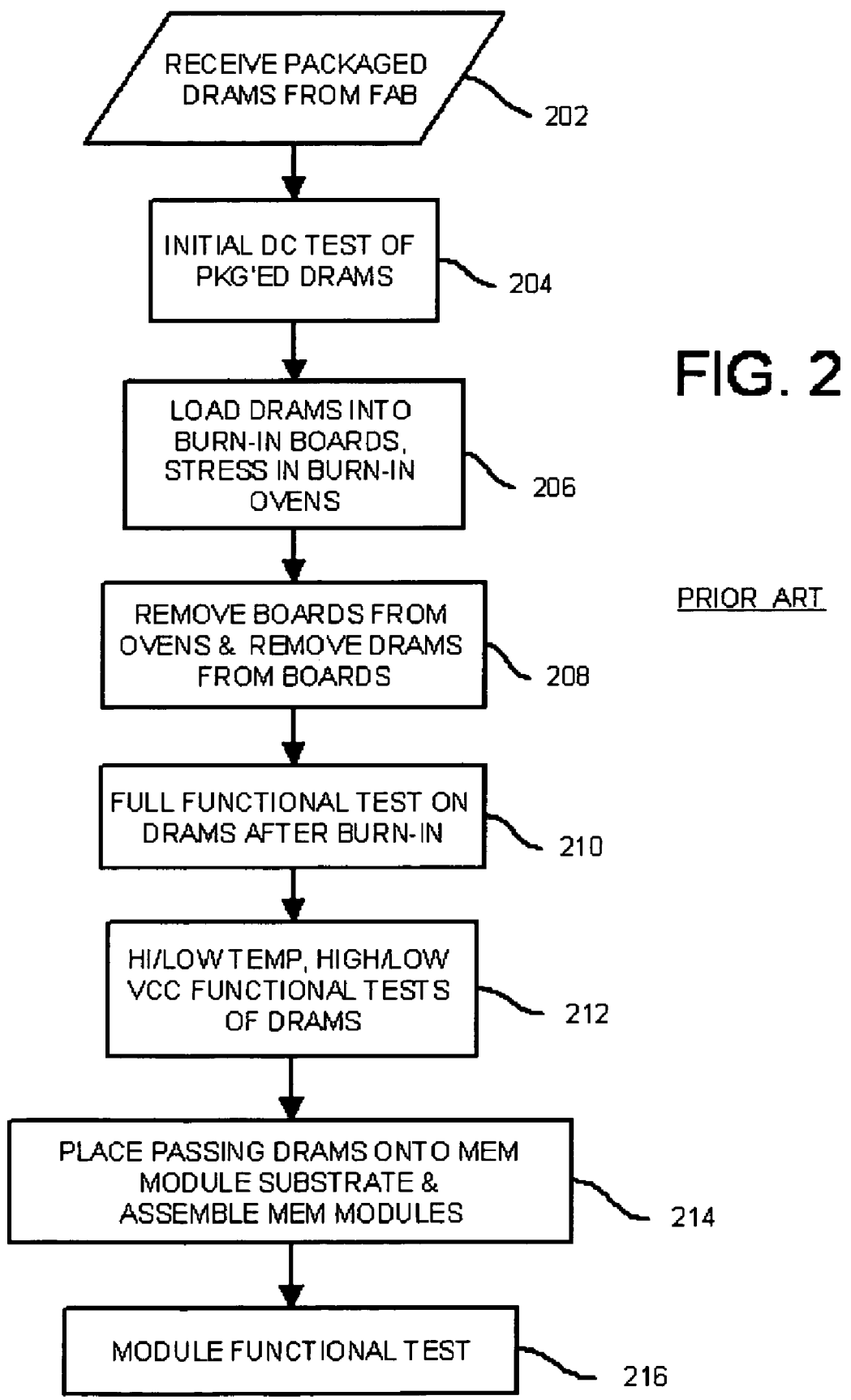
FIG. 2 is a flow chart of a prior-art burn-in test flow for making memory modules.

Thus 7 insertion steps and 7 removal steps are eliminated using the flow of FIG. 4 rather than the flow of FIG. 2. This results in a significant savings in operator time and handling costs. Even if automated insertion/removal equipment were used, savings in equipments costs and usage time occur.

Figure 5:
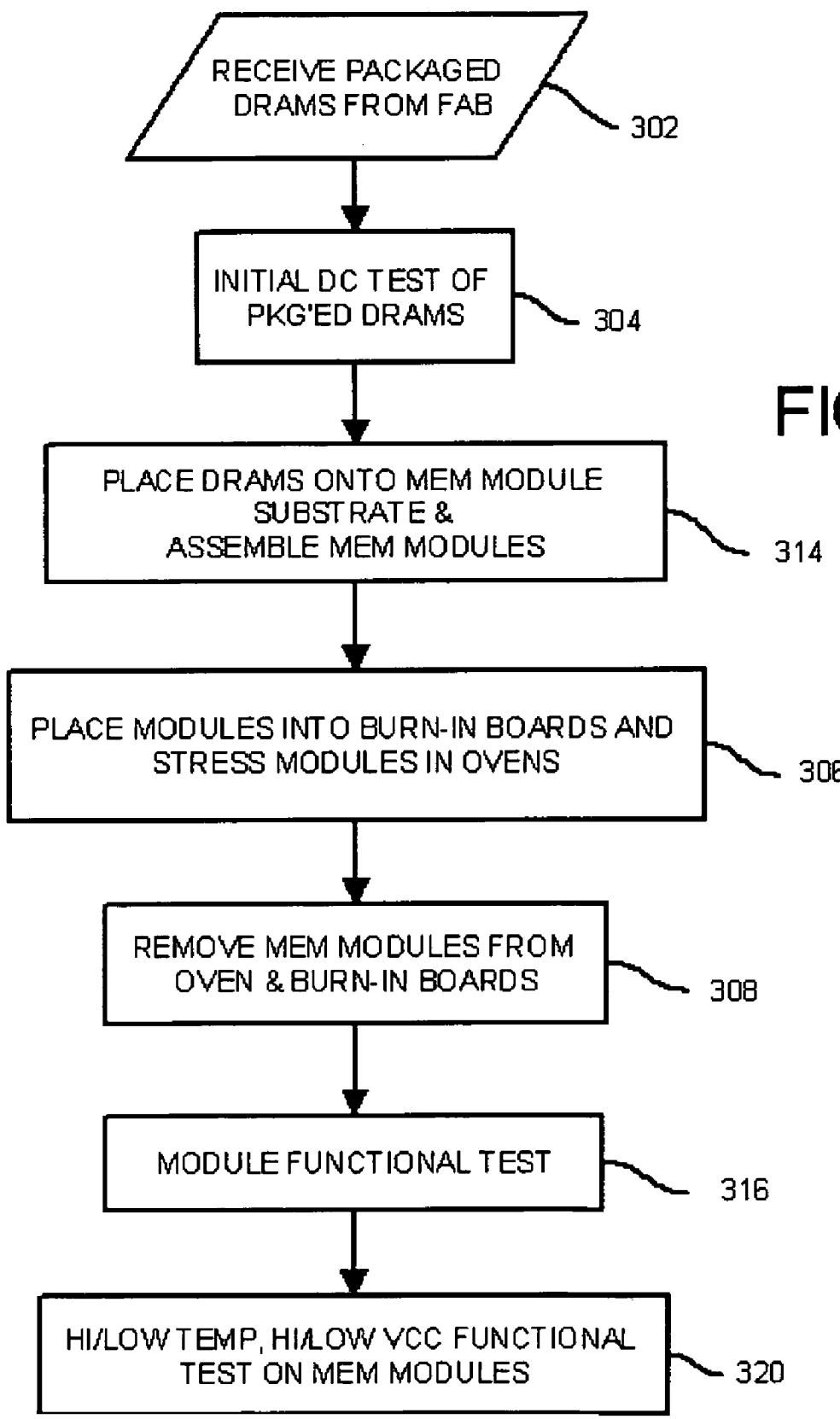
FIG. 5 is a flowchart of a memory-module manufacturing flow that performs burn-in testing of assembled modules rather than individual memory chips before assembly.

FIG. 5 is a flowchart of a memory module manufacturing flow that performs burn-in testing of assembled modules rather than individual memory chips before assembly. DRAM chips are made in wafer form at a wafer fab, and various tests on test chips are performed by the wafer fab to ensure that the wafers are good. The DRAM chips on the wafers are tested using a probe card at a wafer-sort facility, and the good DRAM chips are packaged into packages, such as TSOP or BGA packages. Since a probe card is used, high-speed testing is not performed. Some simple test patterns may be tested at wafer sort, in addition to test for opens, shorts, current drain, etc., but extensive testing with many test patterns is not performed to keep the test cost low.

The packaged DRAM chips are received from the wafer fab and wafer-sort facility, step 302. An initial DC test of the packaged DRAM chips may be performed by the memory-module manufacturer, step 304, or the manufacturer may rely on a test performed by the wafer-sort and/or packaging facility. This initial DC test is a minimal test to prevent bad chips from being assembled into a memory module. The initial DC test checks for basic defects that may occur during packaging, such as open or shorted pins, and DC parameters such as current draws that are out-of-spec. Some simple memory patterns and some speed grading may be performed on the packaged DRAM chips. However, extensive test patterns are not run so that test time and cost is minimized. An expensive, million-dollar automated-test-equipment (ATE) machine may be used to test the DRAM chips for step 304.

The passing DRAM chips are placed and soldered onto memory module substrates during module assembly, step 314. Other components, such as capacitors and buffer chips may be assembled with the DRAM chips, or at a different step. The finished memory modules may be tested using a simple module tester that checks for module assembly defects such as open or shorted module leads, and high power-supply or other lead currents. Simple test patterns that write and read data from DRAM chips on the assembled memory modules could also be performed by the module tester, although this test is optional.

The assembled memory modules are inserted into memory module sockets on memory-module burn-in boards, step 306, and the memory-module burn-in boards are loaded into a burn-in oven. The assembled memory modules are stressed in the oven by high temperatures and high voltages that may be applied to various pins of the memory modules. For example, the oven may heat the memory modules to 100 degrees Celsius, and a high power-supply voltage, such as the specified Vcc plus 10%, may be applied to the power-supply pins. Other input pins on the memory modules may have the Vcc+ 10% voltage applied constantly, or may toggle between low and high voltages. Ideally, simple test patterns that write and read memory locations are applied to the memory modules during burn-in testing, and checking of results read out may also be performed.

The memory-module burn-in boards are removed from the burn-in oven, and memory modules are removed from the memory-module burn-in boards, step 308, after burn-in is complete. Burn-in may take several hours or days, and the length of time may be determined empirically, statistically, or by experience. If testing and checking of results was performed during burn-in testing, modules that failed while in the burn-in oven may be identified and sent for further testing or re-work.

Extensive functional testing is now performed on memory modules that passed the burn-in oven. While an automated-test-equipment (ATE) tester may be used for module functional testing, test costs may be significantly reduced using a PC-based memory module tester as shown later in FIG. 7. Many memory patterns are applied to the memory modules during the functional test of step 316. Patterns can include checkerboard, walking-ones and walking-zeros, marching, all-high and all-low patterns for output-current checks, and other patterns.

Since 4, 8, or more DRAM chips are mounted onto each memory module, many DRAM chips are tested during the memory module functional test. Deeply embedded defects within a DRAM chip may be uncovered during these functional tests. Infant mortality defects that do not appear at first may not have matured into detectable defects after the burn-in testing. Any defects in module assembly may also be detected.

It is well known that the electrical performance of semiconductor devices degrades at high temperature. In addition, some memory-cell defects are only manifested at low temperature. The temperature and applied voltages may be varied during the module functional tests to check for operation at corner conditions, step 320. For example, in environmental testing the functional tests may be repeated for low and high temperatures of 0 and 80 degrees, and the power-supply voltage may be adjusted to + and −10%. All four corners may be tested, or just the worst-case corner (high-temp, low-Vcc). The environmental testing may occur after room-temperature testing, or in place of room-temperature testing.

Memory modules that pass all functional tests for all corners may be sold as highly-reliable modules. The reputation of the memory module manufacturer may be enhanced by the extensive burn-in and testing, while costs and prices are kept low due to the use of module burn-in and test equipment and steps rather than DRAM chip burn-in and testing operations on many more devices.

Figure 6:
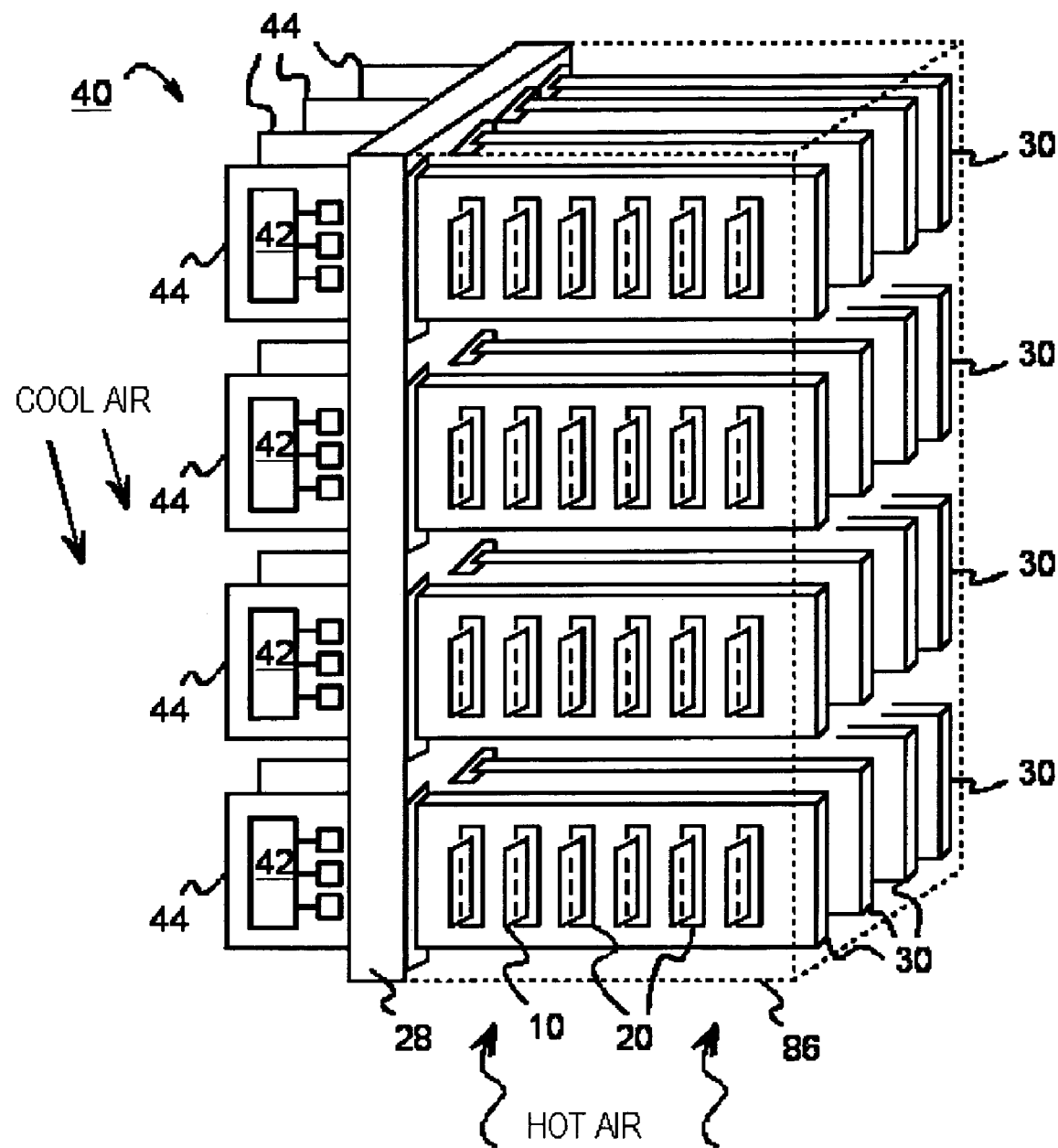
FIG. 6 is a perspective view of a memory-module burn-in chamber/tester.

Memory-Module Burn-In Chamber—FIG. 6

FIG. 6 is a perspective view of a memory module burn-in chamber/tester. Burn-in chambers that accept memory modules plugged into memory-module burn-in boards may be used as burn-in oven 114 of FIG. 4. For example, a memory-module burn-in chamber that also performs some testing of memory modules while inside the burn-in oven is described in U.S. Pat. No. 6,910,162. Hot air can be blown into the bottom or sides of heat chamber 86, rising past module motherboards 30 to raise the temperature of memory modules 10 inserted into memory-module sockets 20. Module motherboards 30 may correspond to memory-module burn-in boards 116 of FIG. 4.

Backplane 28 provides electrical connection from each pattern-generator card 44 to each module motherboard 30, and also provides some thermal insulation. A layer of foam insulation may be attached to backplane 28 and to the sides of heat chamber 86. Pattern-generator cards 44 are kept cooler than module motherboards 30 because back area 40 is separated from heat chamber 86 by backplane 28.

Cool air can be blown across pattern-generator cards 44 while hot air is blown through the heat chamber across module motherboards 30. Pattern generators 42 on pattern-generator cards 44 can be kept cooler than memory modules 10, allowing for longer life and better current drive of pattern generator 42.

Backplane 28, pattern-generator cards 44, and module motherboards 30 can be mounted on a rack that is enclosed by heat chamber 86. Several racks can be mounted on top of each other, or beside one another in a larger burn-in unit enclosure. Hot air can be blown in from the bottom or sides of the unit. Local heaters, thermocouples, or other temperature-sensors can also be used to better regulate and control heating. The unit could be turned, rotated, flipped, or otherwise re-oriented. Cooling, humidity, or other environmental testing could also be performed.

Backplane 28 can route power and ground to all pattern-generator cards 44 and all module motherboards 30. Monitoring and control signals can also be routed through backplane 28, such as reset signals to pattern generators 42 or result or status data from pattern generator 42 to a central controller or network interface to a host.

Figure 7:
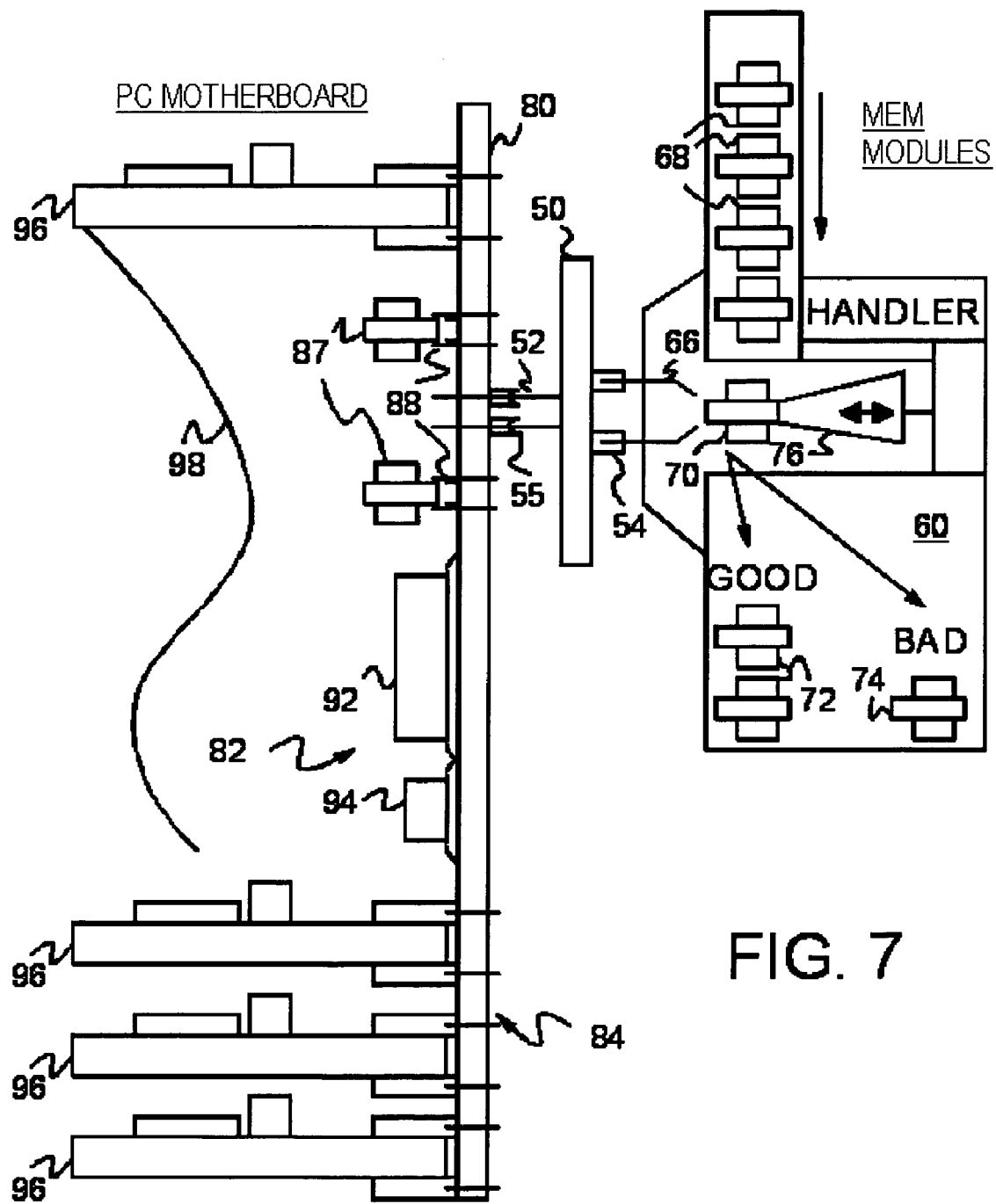
FIG. 7 shows a memory-module tester that is constructed from a personal computer PC motherboard.

PC-Based Memory-Module Tester—FIG. 7

After memory modules are removed from memory-module burn-in boards when burn-in is completed, extensive functional tests are performed on the module. FIG. 7 shows a memory-module tester that is constructed from a personal computer PC motherboard. See for example U.S. Pat. Nos. 6,357,022, 6,351,827, and 6,742,144.

While memory modules could be manually inserted into a memory module test socket on the tester, a memory-module handler that automates insertion and removal of memory modules is desirable. Handler 60 is mounted close to the backside of the PC motherboard using handler adaptor board 50. Handler 60 is not drawn to scale since it is several times larger than a PC motherboard.

Handler 60 is mounted by reverse attachment to the solder-side of the PC motherboard rather than to the component-side of the PC motherboard. The memory module socket on the component side of the PC motherboard is removed, and handler adapter board 50 is plugged from the backside into the holes on the PC motherboard for the memory module socket. Handler adapter board 50 is a small epoxy-glass circuit board designed to interface a handler to a PC motherboard.

Contactor pins 66 within handler 60 clamp down onto leadless pads on the edge of module-under-test MUT 70 when arm 76 pushes MUT 70 into place for testing. Contactor pins 66 include enough pins for all power, ground, and I/O leads on MUT 70.

Contactor pins 66 are electrically connected to connectors on the backside of handler 60. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be directly soldered to PC motherboard substrate 80 using the holes exposed when the memory-module socket was removed, or adaptor pins 52 can be plugged into female pins 55 that are soldered onto solder-side 84 of the PC motherboard. Female pins 55 have extensions that fit into the through-holes exposed by removal of the SIMM socket, but also have cup-like receptacles for receiving adaptor pins 52. Using female pins 55 allows handler adaptor board 50 to be easily removed from substrate 80.

Once MUT 70 has been tested by a test program running on the PC motherboard, MUT 70 is sorted and drops down into either good bin 72 or bad bin 74. Sorting is in response to a pass/fail signal from the test program running on the PC motherboard.

Substrate 80 of the PC motherboard is a conventional multi-layer epoxy-fiberglass circuit board. Components 92, 94 are mounted on component-side 82 of substrate 80. Memory modules 87 fit into memory module sockets 88 that have metal pins that fit through holes in substrate 80. These pins are soldered to solder-side 84 of substrate 80 to rigidly attach sockets to the PC motherboard. Expansion cards 96 are plugged into expansion sockets that are also mounted onto component-side 82 of substrate 80. Cables 98 that are plugged into expansion cards 96 connect peripherals such as disk drives, video display monitors, and multimedia devices to the PC.

Since the memory module tester is constructed from an inexpensive PC motherboard, the cost of the tester is several orders of magnitude smaller than the cost of a million-dollar automated-test-equipment (ATE) machine. Thus test costs are significantly reduced by using a PC-motherboard-based tester. Many different test patterns may be applied to the memory module under test, and the voltages and temperature may be varied to perform corner testing. Hot or cold air may be blown onto the memory module under test by a nozzle (not shown), while the voltage applied to the memory module under test may be adjusted by handler adaptor board 50 or by the PC motherboard.

Figure 8:
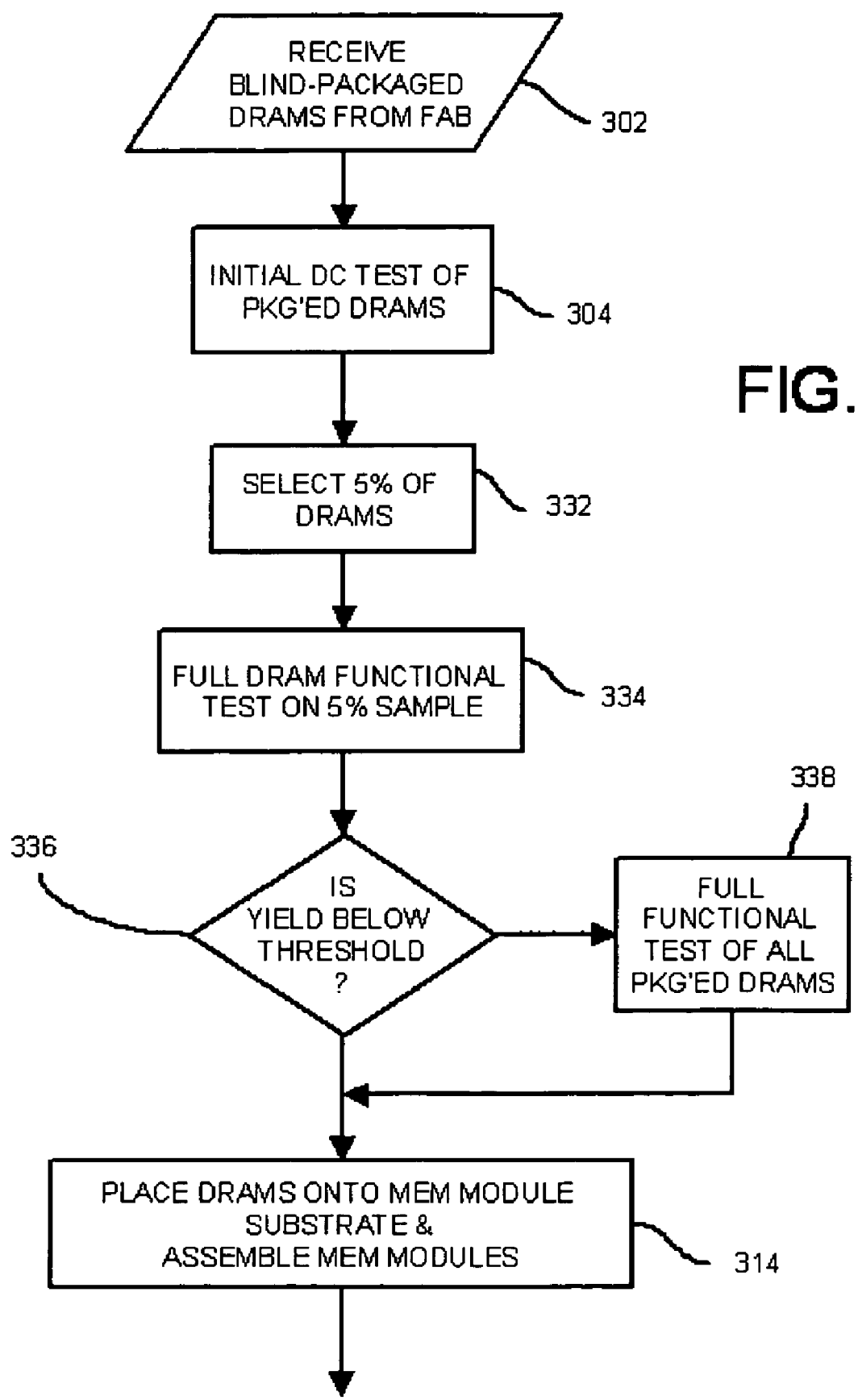
FIG. 8 is a flowchart of a yield-sampling method.

Yield-Sampling Alternative—FIG. 8

Memory modules that fail functional testing may be re-worked and possibly repaired, such as by replacing a defective DRAM chip or re-soldering a loose connection. A small percentage of the modules, such as 1%, may need to be reworked. However, sometimes the yield of DRAM chips from the wafer fab is low, and failures are more common. A yield-sampling method may be used as an alternative to detect low-yield batches of DRAM chips that may occasionally be received. The sampling method also detects problems with the packaging process.

FIG. 8 is a flowchart of a yield-sampling method. Packaged DRAM chips are received from the packaging vendor or wafer fab, step 302. These DRAM chips may have been tested before separation from the wafer at wafer-sort to discard grossly defective die. The packaged DRAM chips may be tested at the packaging vendor, or may be received as blind-packaged parts that have received little or no testing after packaging. Such blind-packaged chips may be available at a discount, further reducing costs.

An initial test that performs minimal testing on the DRAM chips, such as only open/shorts testing, may be performed as initial test step 304. Initial test step 304 could also include a few simple test patterns or current measurements.

A small sample of the incoming DRAM chips for each batch is selected, step 332, such as 5% of the number of DRAM chips in the batch. All of the DRAM chips in the batch were produced in the same production run in the wafer fab. A more extensive functional test is performed on these DRAM chips in the sample, step 334. This functional test includes many test patterns that write and read all memory locations in the DRAM chips. Thus faults caused by a single memory cell are detected by the functional test. Failing DRAM chips are discarded.

The results of the functional test on the DRAM sample is compared to a threshold yield, step 336. When the sampled yield is below this threshold yield, full functional tests are performed on the rest of the batch of DRAM chips, step 338. DRAM chips failing the functional test are discarded. The DRAM chips passing this functional test can then be safely used to assemble memory modules, step 314. The flow can continue with modules being inserted into memory-module burn-in boards for module burn-in step 306 of FIG. 5.

For many world-class wafer fabs, the tested yield should be above the threshold yield for most batches. When the sampled yield is above this threshold yield, the remaining DRAM chips do not have to be fully tested. Step 338 is skipped. Instead, the DRAM chips in the batch are assembled into memory modules, step 314. The flow continues with assembled modules being inserted into memory-module burn-in boards for module burn-in step 306 of FIG. 5.

The threshold yield can be adjusted to minimize manufacturing costs. Thresholds may differ for different DRAM chips from different wafer fabs, or for different sizes of DRAM chips. For example, the threshold yield could be set at 95% to 97%.

An abnormally low yield of DRAM chips is detected early using this sampling method. Full testing of DRAM chips is performed for low-yielding batches to prevent assembly into memory modules and excessive rework rates. Thus overall manufacturing and testing costs may be minimized.

ALTERNATE EMBODIMENTS

Several other embodiments are contemplated by the inventor. For example, many kinds of memory modules can be assembled, burned-in, and tested. Modules using standard DRAM or newer EDO and synchronous DRAM can be substituted. Other memories such as RAMBUS modules, DDR modules, and PC133 synchronous modules may be tested. Memory chips may be dynamic RAM's, static RAM's, hybrid RAM's that have both DRAM and SRAM, specialty memories, of other types of memory chips.

Various sizes of memory in the memory module, and form factors for memory modules can be used with the invention, although different sockets on the memory-module burn-in boards may be needed. Non-PC motherboards can also be substituted. The invention can be applied to any target system board. The system is ideally suited for testing the highest-speed memory modules, since signal trace length and capacitive loading is minimized.

The various steps may be combined or divided, and some re-arrangement of the order of steps may be possible. An initial test may perform a few test patterns that write and read memory, such as 1, 2, or 4 patterns, while more extensive functional tests include 10 or more test patterns. Thus the initial test results in partially-tested DRAM chips, while an extensive test produces fully-tested DRAM chips, although the DRAM chips may later fail due to infant mortality or aging failures. While all memory locations may not be written and read for initial tests, all memory locations are written and read several times in functional tests. The test patterns may be generated externally or internally generated by the DRAM chips using a built-in self tester.

While a memory module with 8 DRAM chips has been described in the example, memory modules with different numbers of DRAM chips can benefit form the invention, such as modules with 4 DRAM chips, 10, 12, 16 or more DRAM chips or other numbers of DRAM chips. The term "pins" may refer to leads, pads, bent pins, straight pins, solder balls, or other kinds of electrical connectors, and is not limited to pointed metal pins.

Some embodiments may have special test sockets, ejectors on cards, or may have other handling or insertion/removal devices. A Yamaichi type connector could be used as the memory-module sockets, but a production-quality connector/socket with low insertion force may be substituted. A production quality connector/socket can take more insertions (greater than 100,000 times) than conventional sockets on motherboards (rated for 100 insertions). A production socket also has an ejector normally located at the two edges of the socket. This alleviates the ejection of modules. Many variations in shapes and cross sections can be substituted. Desirable flow rates and heating loads can often be determined empirically.

Rather than blow in heated air from the top, the heated air may enter burn-in oven from other locations such as the sides or bottom. Pattern generator cards 44 could use a standard DRAM controller activated by a programmable device such as a processor or state machine, or pattern generators could be a state machine or controller. Buffers could be located on pattern-generator card 44 in the cooler environment, or could be located on module motherboard 30 in the hot environment, but closer to the memory modules being driven. Some buffers, registers, or clock drivers could be on pattern-generator card 44 while others are on module motherboard 30 or even on backplane 28. Patterns could be generated to write all locations on large DRAM chips, such as by writing to a million or more addresses.

During writes, all memory modules may be selected and written in parallel at the same time. There can be separate module select lines (static, not dynamic) for each module. Writing can happen concurrently on all modules. During read, only one module is selected, and a bus conflict is avoided. The read data can be read back or ignored. The address, data, and most control lines are bussed in parallel; the module select lines are not. The module select lines are DRAM chip selects which are made available as pins on the memory module for the module select function.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A memory-module manufacturing method comprising:

receiving partially-tested memory chips, wherein the partially-tested memory chips are packaged dice that have not been fully tested to detect all defects;

soldering the partially-tested memory chips onto module substrates to create assembled memory modules;

inserting the assembled memory modules into module sockets on memory-module burn-in boards;

placing the memory-module burn-in boards into a burn-in oven;

stressing the assembled memory modules and the partially-tested memory chips soldered to the module substrates of the assembled memory modules by heating the assembled memory modules in the burn-in oven for a burn-in period of time;

removing the memory-module burn-in boards from the burn-in oven after the burn-in period of time and extracting the assembled memory modules from the memory-module burn-in boards as burned-in memory modules; and fully testing the burned-in memory modules by applying extensive test patterns to the burned-in memory modules;

wherein the extensive test patterns test for possible defects that were not detected in the partially-tested memory chips;

whereby partially-tested memory chips are soldered into assembled memory modules that are burned-in and fully tested.

2. The memory-module manufacturing method of claim 1 further comprising:

environmental testing the burned-in memory modules by applying elevated temperature and voltage conditions to the burned-in memory modules while applying extensive test patterns to the burned-in memory modules, whereby memory modules are environmentally tested.

3. The memory-module manufacturing method of claim 1 further comprising:
voltage stressing the assembled memory modules during the burn-in period of time while being heated in the burn-in oven by applying elevated voltages to inputs of the assembled memory modules.

4. The memory-module manufacturing method of claim 3 further comprising:
applying test-pattern inputs to the assembled memory modules while in the burn-in oven;
wherein the assembled memory modules are further stressed by test-pattern inputs that exercise the partially-tested memory chips on the assembled memory modules.

5. The memory-module manufacturing method of claim 4 further comprising:
writing and reading memory locations within the partially-tested memory chips by applying the test-pattern inputs to the assembled memory modules while in the burn-in oven;
wherein the test-pattern inputs write and read memory locations on the partially-tested memory chips on the assembled memory modules.

6. The memory-module manufacturing method of claim 1 further comprising:
performing an initial screen test on the partially-tested memory chips, wherein the initial screen test detects open and shorted inputs and outputs of the partially-tested memory chips.

7. The memory-module manufacturing method of claim 6 wherein the initial screen test does not fully test each memory location for all possible single-bit defects including shorts to adjacent memory locations;
wherein the extensive test patterns applied to the burned-in memory modules fully test each memory location in the partially-tested memory chips soldered onto the burned-in memory modules for detecting all possible single-bit defects including shorts to adjacent memory locations,
whereby some single-bit defects are not detected by the initial screen test and are detected by the extensive test patterns performed on the burned-in memory modules.

8. The memory-module manufacturing method of claim 6 wherein fully testing the burned-in memory modules further comprises:
writing and reading each memory location on the partially-tested memory chips soldered onto the burned-in memory modules at least four times per memory location to detect all possible single-bit defects including shorts to adjacent memory locations,
whereby some single-bit defects are not detected by the initial screen test and are detected by the extensive test patterns performed on the burned-in memory modules.

9. The memory-module manufacturing method of claim 1 wherein a number of insertions into sockets on burn-in boards is reduced by N−1, wherein N is a number of the partially-tested memory chips per memory module,
whereby insertions of assembled memory modules are reduced compared with insertions of individual memory chips.

10. The memory-module manufacturing method of claim 9 wherein N is 8 partially-tested memory chips per assembled memory module.

11. The memory-module manufacturing method of claim 2 wherein fully testing the burned-in memory modules comprises:
inserting the burned-in memory modules into a test socket that electrically connects to a memory bus on an adapted personal computer motherboard;
running a test program on the adapted personal computer motherboard that writes and reads through the memory bus and test socket to memory locations on the partially-tested memory chips soldered on the burned-in memory modules;
whereby the burned-in memory modules are tested using the adapted personal computer motherboard.

12. The memory-module manufacturing method of claim 11 further comprising:
performing an initial screen test on the partially-tested memory chips by inserting the partially-tested memory chips into an automated-test-equipment (ATE) tester,
wherein a cost of the ATE tester is at least 10 times more than the cost of the adapted personal computer motherboard that tests the burned-in memory modules,
whereby an inexpensive tester is used for testing memory modules.

13. The memory-module manufacturing method of claim 1 further comprising:
reworking memory modules that fail the extensive test patterns applied while fully testing the burned-in memory modules,
whereby failing memory modules are reworked.

14. The memory-module manufacturing method of claim 13 wherein reworking memory modules comprises replacing a defective partially-tested memory chip on a memory module with another partially-tested memory chip to generate an assembled memory module,
whereby defective partially-tested memory chips are replaced during reworking.

15. The memory-module manufacturing method of claim 1 further comprising:
sampling the partially-tested memory chips by selecting a sample of the partially-tested memory chips;
fully testing the sample of the partially-tested memory chips and generating a yield that indicates a fraction of the sample that failed;
comparing the yield to a yield threshold;
when the yield is below the yield threshold, fully testing all partially-tested memory chips in a batch before soldering the partially-tested memory chips to the module substrates;
when the yield is above the yield threshold, soldering the partially-tested memory chips to the module substrates without full testing of remaining partially-tested memory chips in the batch,
whereby batches of the partially-tested memory chips are sampled to determine when the yield is below the yield threshold.

16. The memory-module manufacturing method of claim 15 wherein the sample is about 5% of a number of the partially-tested memory chips in the batch.

17. A memory module made by the memory-module manufacturing method of claim 1.

18. A manufacturing method for producing reliable memory modules comprising:
partially testing memory chips to initially screen out defective memory chips having open or shorted pins;
soldering memory chips to a substrate to assemble a memory module, wherein each memory module contains N memory chips, wherein N is at least 2;
wherein memory chips are soldered to the substrate before being fully tested and before being burned-in;

inserting the memory module into a socket on a memory-module burn-in board;

inserting the memory-module burn-in board into a burn-in oven;

stressing the memory module on the memory-module burn-in board in the burn-in oven by applying elevated temperature and voltage;

removing the memory-module burn-in board from the burn-in oven and removing the memory module from the memory-module burn-in board; and functionally testing the memory module after burn-in by applying test patterns that write and read all accessible memory locations on the memory chips in the memory module;

wherein each memory location is written at least four times when being functionally tested;

wherein reliability of the memory modules is enhanced by detecting failures after burn-in, while manufacturing cost is reduced by inserting and removing memory modules from the burn-in oven rather than individual memory chips.

19. The manufacturing method of claim 18 wherein functionally testing the memory module after burn-in comprises heating the memory module to an elevated temperature and applying a reduced power-supply voltage below a standard power-supply voltage when the test patterns are applied.

20. The manufacturing method of claim 19 further comprising:

selecting a sample of the memory chips;

testing the sample of the memory chips using sample test patterns that are able to detect more defects than initial test patterns used when partially testing the memory chips to initially screen out defective memory chips having open or shorted pins;

determining a yield for the sample that depends on a number of failing memory chips; and comparing the yield to a target to determine when to test remaining memory chips in a lot containing the sample with the sample test patterns, and when to test remaining memory chips with just the initial test patterns, whereby yield of the memory chips is sampled.

* * * * *